United States Patent [19]

Hobbs

[11] Patent Number: 4,994,807

[45] Date of Patent: Feb. 19, 1991

[54] VOLTAGE-TO-FREQUENCY CONVERTER

[75] Inventor: Larry P. Hobbs, Brentwood, Calif.

[73] Assignee: Systron Donner, Concord, Calif.

[21] Appl. No.: 529,972

[22] Filed: May 25, 1990

[51] Int. Cl.$^5$ .............................................. H03M 1/60
[52] U.S. Cl. ..................................... 341/157; 341/166
[58] Field of Search ............... 341/155, 158, 159, 157, 341/166, 167, 168, 172

[56] References Cited

U.S. PATENT DOCUMENTS

| | | | |
|---|---|---|---|
| 4,034,364 | 7/1977 | Fukuda et al. | 341/158 |
| 4,529,965 | 7/1985 | Lee | 341/172 X |
| 4,672,361 | 6/1987 | Kokubo | 341/166 X |

Primary Examiner—William M. Shoop, Jr.
Assistant Examiner—Howard L. Williams
Attorney, Agent, or Firm—Flehr, Hohbach, Test, Albritton & Herbert

[57] ABSTRACT

A DSB-SC signal is demodulated using an up/down counter, the count direction of which is alternately switched in synchronism with the polarity of a reference carrier signal for the DSB-SC signal. The converter includes an integrator, a comparator and a charge-rebalancing current source to reset the integrator. Correction of the court value of the up/down counter is obtained by tracking and storing a partial-bit analog signal. The partial-bit analog signal corresponds to and is obtained from the output of the integrator just prior to the pahse transition of the reference carrier signal. A capacitor samples the partial-bit analog signal information and subsequently transfers that information to the integrator input. The transfer of a charge of twice the magnitude and opposite polarity to the integrator compensates for the partial bit analog signal as it is detected by the up/down counter. A digital system for converting the partial-bit analog signal to a binary code word is provided. A number of these binary code words are summed and when the resultant sum exceeds a certain value a correction count for the up/down counter is provided to increment the up/down counter.

7 Claims, 4 Drawing Sheets

VOLTAGE-TO-FREQUENCY CONVERTER

BACKGROUND OF THE INVENTION

1. Field of the Invention

This invention relates to voltage-to-frequency converters and, more particularly, to voltage-to-frequency converters having increased resolution.

2. Prior Art

Conventional integrating voltage-to-frequency converters operating over an output frequency range of 0 to 10 MHz. are limited in their resolution. To obtain increased resolution, a direct solution is to increase the frequency range of output pulses to 0–400 MHz, or ±200 mHz. Obviously, operation in these much higher frequency ranges creates significantly more difficult circuit design and fabrication problems than does operation in a 0 to 10 MHz range.

Another solution to increasing resolution in a conventional integrating voltage-to-frequency converter is to use an interpolation type of approach to obtain increased resolution. This approach uses a voltage to frequency converter to obtain, in effect, the most significant bits MSBs for a sample of an original analog input signal. The MSBs are then reconverted to an analog version of the MSBs which are in turn, subtracted from the sample of the original analog input signal to create an analog difference sample signal. This analog difference signal is then converted to a digital format with an A/D converter to create, in effect, the least significant bits LSBs for the sample of the original analog input signal. The information contained in the LSBs can be used to provide increased resolution. However, this type of interpolation method adds complexity because of the need for A/D circuits, sample-and-hold circuits, digital latches, adder/subtractors, etc.

SUMMARY OF THE INVENTION

It is therefore an object of the invention to provide a voltage-to-frequency converter with improved resolution without increasing the nominal pulse repetition rate.

In accordance with this and other objects of the invention, an improved integrating voltage-to-frequency converter for converting a double-sideband, suppressed carrier DSB-SC signal into a frequency-encoded signal is provided. The DSB-SC signal is demodulated using an up/down counter demodulator, which is alternatively switched between an up-count and a down-count in synchronism with the phase transitions of the reference carrier signal for the DSB-SC signal. The output of the up/down counter provides an output signal which represents in a digital form the information modulated onto the DSB-SC signal. The converter includes an integrator, a comparator, and means for rebalancing the integrator circuit by injecting predetermined amounts of charge to the inverting input terminal of an operational amplifier.

The invention includes means for tracking and storing partial-bit analog signal level information provided at the output of the integrator just prior to a phase transition of the reference carrier signal. The reference carrier signal is used to change the count direction of the up/down counter. Means are provided for correcting the count of the up/down counter to account for the partial-bit analog signal information. In one embodiment of the invention the converter includes means for accumulating partial-bit analog signal level information wherein the means for accumulating and the means for correcting further includes means for injecting a charge which is opposite in sign and two times the magnitude of the partial-bit analog signal level into the non-inverting input terminals of the operational amplifier. This occurs immediately subsequent to the phase transition of the reference carrier signal to thereby effectively include the effect of a partial-bit analog signal level from a first half-period of the reference carrier signal into the next half-period of that reference signal. The result of this is that when a DSB-SC signal is demodulated using the up/down counter, the partial-bit information is included in the resultant output count of the up/down counter demodulator.

According to another aspect of the invention the converter means for correcting includes means for converting the partial-bit analog signal level to a binary code word. Similar means are provided for algebraically adding a number of binary code words formed from the partial-bit analog signal levels to thereby form an algebraic sum thereof. Means for detecting that the algebraic sum exceeds a value sufficient to form a correction count for the up/down counter are provided. Means are provided for incrementing the up/down counter with that correction count.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
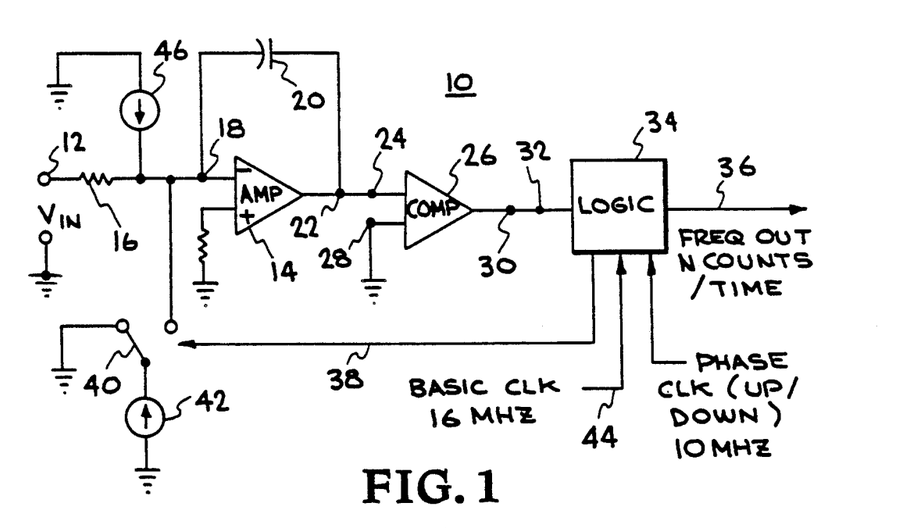
FIGURE 1 is a block diagram of a prior art voltage-to-frequency converter.

FIG. 1 shows a conventional, prior-art, voltage-to-frequency converter circuit 10, which receives an input voltage signal Vin at an input terminal for an operational amplifier 14 configured as an active integrator circuit. A series input resistor 16 is connected between the input terminal 12 and an inverting input terminal 18 of the operational amplifier. An integrating capacitor 20 is connected between an output terminal 22 and the inverting input terminal 18 of the operational amplifier 14. The output terminal 22 of the operational amplifier 14 is connected to an input terminal 24 of a comparator 26. The other input terminal 28 of the comparator is connected to a reference voltage. When the output signal level of the integrator exceeds the ground reference voltage level, the comparator 26 provides an output signal at an output terminal 30, which is coupled to an input terminal 32 of a logic circuit 34. The logic circuit 34 provides an output pulse at an output terminal 36 for each of the output signals from the comparator 26. The repetition rate of the output pulses is proportional to the amplitude of the input voltage signal to the voltage-to-frequency converter circuit. For each output pulse from the comparator 26, a rebalance control pulse signal is generated by the logic circuit 34 and provided on a signal line 38 to control a current switch, diagrammatically shown as 40, for connecting a rebalance current source 42 to the inverting input terminal 18 of the operational amplifier 14. The pulse width of a rebalance control pulse is set by a basic system clock signal having a frequency of, for example, 16 mHz and provided at an input terminal 44 to the logic circuit 34. Each of the rebalance control pulses connects the rebalance current source 42 to the inverting input terminal 18 of the operational amplifier 14 for a predetermined period of time as determined by the pulse width of the rebalance clock pulse. This provides a rebalancing charge to reset the integrator to a starting point for the next integration cycle. A bias-current source 46 is connected to provide a bias, or offset, current to the input terminal 18 of the operational amplifier 14, permitting the input voltage signal Vin to be unipolar or bipolar.

Various types of input voltage signals can be converted to a frequency-encoded format by a voltage-to-frequency converter. In precision measurement applications, a signal, representing variation in whatever parameter is being measured, is often encoded as a double-sideband, suppressed carrier DSB-SC signal.

The output signal from a voltage-to-frequency converter of FIG. 1 is demodulated in a demodulator circuit to provide a reconstructed version of the input voltage signal originally fed to the input terminal of the voltage-to-frequency converter circuit. However, the original input voltage signal is not perfectly reconstructed in the demodulator circuit, due to the limited resolution capability of the voltage-to-frequency converter.

Figure 2:
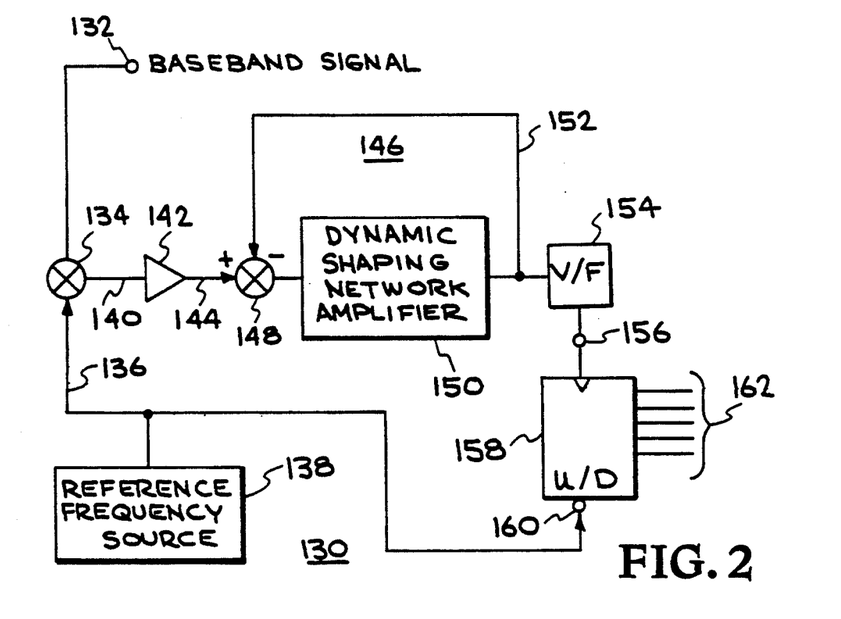
FIG. 2 is a block diagram of a system for frequency-encoding and digitally demodulating a DSB-SC signal.

FIG. 2 shows a system for digital demodulation of a double-sideband, suppressed-carrier DSB-SC signal. The system uses an up-down frequency counter to digitally count the output pulses of a voltage-to-frequency converter. This system is disclosed by reference to U.S. pending patent application Ser. No. 07/257,509 filed Oct. 13, 1988, entitled "Digital Demodulator," invented by G. Richard Newell and Pradeep Bhardwaj, and assigned to the same assignee as the present invention.

FIG. 2 shows a system 130 which digitally demodulates a frequency-encoded DSB-SC signal. A baseband signal is connected to an input terminal 132 of a double-sideband, suppressed-carrier DSB-SC modulator 134. The baseband signal may typically be an analog signal having a frequency range of, for example, dc to several hundred Hertz and may require an accuracy of better than a few parts per million. The modulator 134 is, for example, a balanced modulator which linearly multiplies the baseband signal by a reference-carrier signal provided on signal line 136 from a reference-carrier frequency source 138. This produces a low-level DSB-SC output signal on the signal line 140 connected to the output terminal of the modulator 134. Alternatively, in some applications a DSB-SC signal similar to that on signal line 140 and a reference-carrier signal similar to that provided on signal line 136 are derived in an external circuit and provided as input signals to the system. The DSB-SC signal on line 140 is amplified in an amplifier 142 and then coupled on a signal line 144 to a linear feedback-amplifier subsystem 146. The amplifier subsystem 146 includes a summer 148 which has signal line 144 coupled to the positive input terminal thereof. The summer output is coupled to the input of a dynamic shaping network amplifier 150 which amplifies and filters the DSB-SC signal. The output of the network is then fed back on a feedback signal line 152 to the negative input terminal of the summer 148 to cancel any distortion introduced by the shaping network amplifier 150. The feedback insures that the amplification and filtering are linear processes.

The amplified DSB-SC signal at the output of the amplifier 150 is not converted back down to the baseband analog domain. The DSB-SC signal is AC-coupled to the input of a voltage-to-frequency converter 154, which provides an output signal comprising, for example, a series of digital pulses having a repetition rate, or frequency, which is proportional to the voltage level of the DSB-SC signal. Because the voltage-to-frequency converter is AC-coupled, its input circuitry is not susceptible to dc-voltage level drifts caused by aging, temperature, and irradiation by high energy particles. AC coupling is well suited for applications requiring accuracies better than a few parts in one million.

The output signal pulses of the voltage-to-frequency converter 154 are applied to the input signal terminal 156 of an up/down frequency counter 158. The counter functions as a digital accumulator, or integrator, of the signal pulses from the voltage-to-frequency converter. Since the various frequencies represent the various voltage levels of the DSB-SC signal, the output pulse stream of the V/F converter 154 represents the DSB-SC signal encoded in a "frequency" format, and the output reading of the counter 58 represents the integral of the DSB-SC signal as a digital or binary number.

A reference-frequency signal from the source 138 is applied to the up/down control terminal 160 of the counter 158 to change the direction of the count depending on the polarity of the reference-frequency signal. For an up-count, the input frequency is added to the counter output total; and for a down-count, the input frequency is subtracted from the counter output total. If the reference-frequency signal applied to the up/down control terminal is a square wave with a 50% duty cycle, the reference frequency signal, in effect, alternately multiplies the counter output reading by plus one and by minus one. Multiplication of a DSB-SC signal in this manner by its carrier signal, i.e., the reference-frequency signal, synchronously demodulates the DSB-SC signal to produce the originally encoded baseband signal. Consequently, the output of the up/down counter 58 on data lines 162 is a digital word representing the integral of the baseband signal to an accuracy of one part in a million.

Typical numerical values for a system are: a baseband signal having a frequency range of dc to a few hundred Hz, a reference-frequency signal of 10 kHz., and a voltage-to-frequency full-scale range of zero to 10 MHz. For these exemplary values, it should be appreciated that a DSB-SC output signal frequency ranges over 10 kHz plus or minus a few hundred Hz. and that the corresponding output pulses from a voltage-to-frequency converter have a frequency range of zero to 10 Mhz.

The counting direction of the up-down count is alternately switched in synchronism with the polarity changes of a suppressed-carrier reference signal. For example, during alternate positive half-cycles of the synchronous suppressed-carrier reference signal, the frequency counter up-counts and, during alternate negative half-cycles of the synchronous suppressed-carrier reference signal, the frequency counter down-counts. As previously mentioned, the up-down counter, in effect is synchronously demodulating the DSB-SC signal.

In certain applications, such as for example inertial navigation systems, unacceptable errors may be accumulated in the count value of the up-down counter due to quantizing errors introduced by the voltage-to-frequency converter. A voltage input signal, which is received in a time corresponding to the very end of the positive half-cycle of the subcarrier reference signal, may not have sufficient amplitude to be integrated by the integrator circuit to a level sufficient to exceed the reference voltage level and trigger the comparator circuit to generate an output pulse. This analog input signal information, which is provided either at the very end of a positive half-cycle of the reference signal or at the very end of a negative half-cycle of the reference signal, is carried over into the first part of the next half-cycle of the reference signal as integrated information. This information is called "partial-bit" information and produces an error when the DSB-SC signal is demodulated because the partial-bit information contributes to a count in the up-down counter which has a sense opposite from the sense of the partial-bit information. For example, analog information stored in the integrator during the positive half-cycle of the reference signal should contribute to up-counts. Similarly, analog information stored during the negative half-cycle of the reference signal usually should contribute to down-counts of the up-down counter. The partial-bit information is carried over to the next half-cycle of the reference signal by being stored in the integrator. This partial-bit information is missing from, for example, up-counts and is erroneously used to get down counts. While the effect of partial-bit information is relatively small, errors due to erroneous use of such information accumulate and affect fine resolution performance.

The effect of this type of error is best described with an example. Assume that an input voltage signal nominally causes 250 output pulses to be generated during a reference half-cycle time of 50 microseconds. The ±1 pulse uncertainty in occurrence of the last output pulse in the half-cycle time produces a quantizing error of one part in 250, or 0.4%, which is approximately equivalent to the resolution of an 8-bit code word. This resolution is far less than a desired one part in a million, or 1 ppm.

Figure 3A:
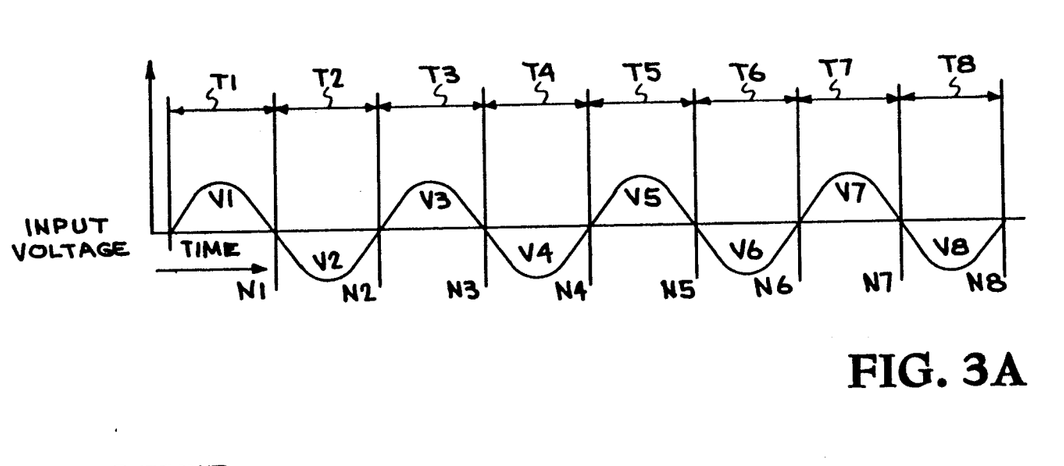
FIG. 3A shows an input signal to the voltage-to-frequency converter of FIG. 1.
Figure 3B:
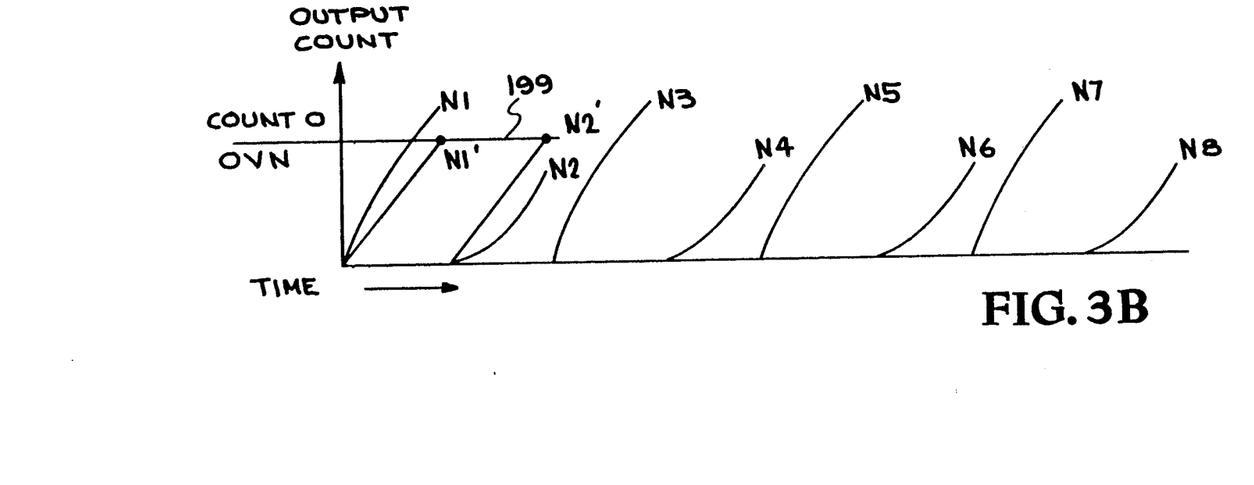
FIG. 3B, is a plot showing the output counts of an up-down counter DSB-SC demodulator of FIG. 2 used with the voltage-to-frequency converter of FIG. 1 for the input signal of FIG. 2A.

FIG. 3A shows an analog input voltage signal which is a 10 kHz sine wave. The periods of a 10 kHz reference subcarrier signal are shown as T1 through T8 in the drawing. The odd periods represent, for example, the positive phases of the reference signal, while the even periods represent the negative phases of the reference carrier. During each of these periods the up/down counter 158 of FIG. 2 counts in one direction or the other as controlled by the phase of the reference signal. FIG. 3B shows the output counts of the up/down counter 158. The counts are shown as N1 through N8. The odd counts, for example, are up-counts while the even counts are down-counts. For no signal input that is for a zero volt input analog input signal, the level 199 as shown in the drawing indicates that the up count N1' and the down count N2' are both the same. Consequently, these two counts would cancel each other. For the case of an input analog signal as shown in FIG. 3A, the positive input analog voltages during the period T1 generate the up-count N1 in the up/down counter 158. During the negative phase of the input analog voltage during the period T2, the up/down counter 158 generates a down-count N2. Similarly, the up/down counter 158 generates the up-counts N3, N5 and N7 during the positive phase of the reference carrier, while the down-counts N2, N6 and N8 are generated during the negative phase of the reference carrier.

Equations 1 through 4 show the relationship between the counts as provided by the up/down counter 158 with and without the improvement according to the invention. The accumulated count N provided by subtracting the down-counts from the up-counts is carried forward by the up/down counter 158.

$$N \text{ OUT (W/O CARRY FWD ERRS)} = (N1+N3+N5+N7) - (N2+N4+N6+N8) \qquad (1)$$

$$N \text{ OUT (IDEAL)} = (N1+\Delta N1+N3+\Delta N3+N5+\Delta N5+N7+\Delta N7) - (N2+\Delta N2+N4+\Delta N4+N5+\Delta N6+N8+\Delta N8) \qquad (2)$$

$$N \text{ OUT (W/O CARRY FWD)} = (N1+N3+\Delta N2+N5+\Delta N4+N7+\Delta N6) - (N2+\Delta N1+N4+\Delta N3+N6+\Delta N5+N8+\Delta N7) \qquad (3)$$

$$N \text{ OUT (W/O C.F.)} - N \text{ OUT (IDEAL)} = (\Delta N0+2\cdot\Delta N2+2\cdot\Delta N4+2\cdot\Delta N6+\Delta N8) - (2\cdot\Delta N1+2\cdot\Delta N3+2\cdot\Delta N5+2\cdot\Delta N7) \qquad (4)$$

Equation 1 describes the accumulated count in the up/down counter 158 when no carry forward errors are considered. Equation 2 shows the count output of the up/down counter 158 for an ideal situation in which the partial bits as represented by $\Delta N1$, $\Delta N3$, $\Delta N5$ and $\Delta N7$ are accumulated for the up-counts and where $\Delta N2$, $\Delta N4$, $\Delta N6$ and $\Delta N8$ are accumulated for the down-counts. In this situation, no errors would occur in the demodulation process.

Equation 3 shows the output count N of the up/down counter 158 when the partial bit errors are accounted for but are not corrected. For example, $\Delta N2$, $\Delta N4$ and $\Delta N6$ are included in the up-count while $\Delta N1$, $\Delta N3$, $\Delta N5$, $\Delta N7$ are included in the down count. Compared to the ideal case as shown in equation 2, the partial bit information is in the wrong count sequence. Equation 4 shows the error terms produced when equation 2, representing the ideal case, is subtracted from equation 3, representing the case without appropriate correction. To remove the error terms of equation 4 from a system, it is necessary to add, for example, a $2\Delta N2$ term to the counter output. Similarly to remove the effect of the $\Delta N1$ error it is necessary to subtract a $2\Delta N1$ count from the up/down counter 158.

Figure 4:
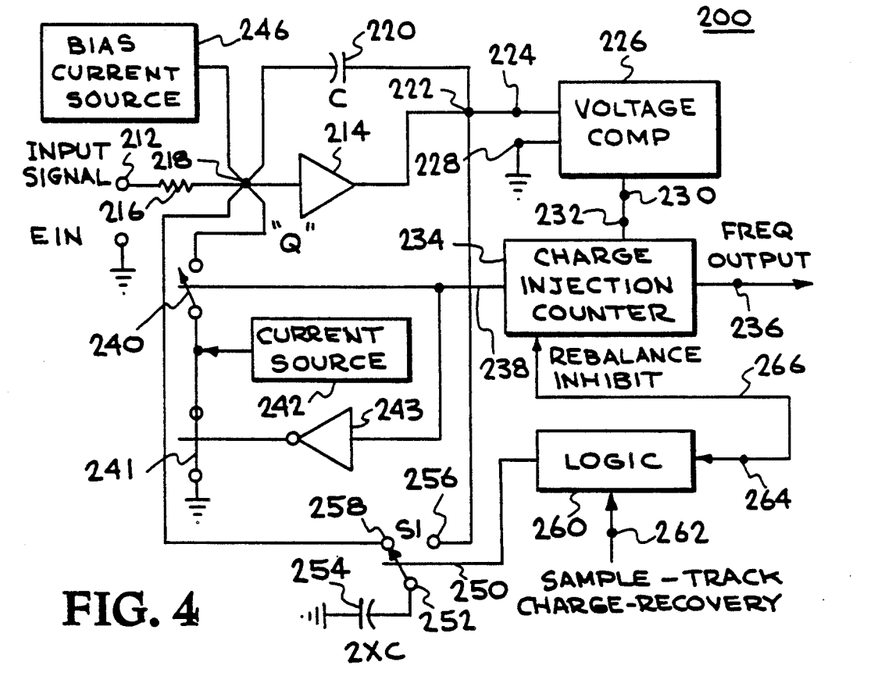
FIG. 4 is a block diagram of one embodiment of a voltage-to-frequency converter according to the present invention.

FIG. 4 shows a block diagram of one embodiment of an improved voltage-to-frequency converter 200 according to the present invention. This voltage-to-frequency converter 200 is similar to the voltage-to-converter of FIG. 1, with additions which will be identified. The converter 200 receives an input voltage signal EIN at an input terminal 212 for an operational amplifier 214 configured as an active integrator circuit. A series input resistor 216 is connected between the input terminal 212 and an inverting input terminal 218 of the operational amplifier 214. An integrating capacitor 220 is connected between an output terminal 222 and the inverting input terminal 218 of the operational amplifier 214. The output terminal 222 of the operational amplifier 214 is connected to an input terminal 224 of a comparator 226. The other input terminal 228 of the comparator is connected, for example, to a reference ground voltage. When the output signal level of the integrator exceeds the reference voltage level, the comparator 224 provides an output signal at an output terminal 230, which is coupled to an input terminal 232 of a charge injection counter circuit 234. The charge injection counter circuit 234 provides an output pulse at an output terminal 236 for each of the output signals from the comparator 226. The repetition rate of the output pulse on terminal 236 is proportional to the amplitude of the input voltage signal EIN. For each output pulse from the comparator 226, a rebalance pulse signal is generated by the charge injection counter circuit 234 and provided on a signal line 238 to control a current switch arrangement which connects a rebalance current source 242 to the inverting input terminal 218 of the operational amplifier 214. The current switch arrangement includes a first current switch 240 controlled by the signal on the signal line 238 and a second current switch 241 which is controlled by an inverted control pulse signal provided by the inverter circuit 243. The second current switch 241 connects the output of the current source 242 to a ground potential to eliminate signal spikes during the switch transition times. The pulse width of a rebalance pulse on signal line 238 is set by the charge injection counter circuit 234 to connect the rebalance current source 242 to the inverting input terminal 218 of the operational amplifier 214 for a predetermined period of time. This provides a rebalancing charge to reset the integrator to a starting point for the next integration cycle. A bias-current source 246 is connected to provide an offset current to the input terminal 218 of the operational amplifier 214, permitting the input signal to be unipolar or bipolar.

To compensate for the partial-bit information which is, in effect, stored on the integrating capacitor 220 immediately prior to the transition of the subcarrier reference signal, means are provided for tracking and storing the partial-bit analog signal information provided at the output of the integrator circuit. The partial-bit analog signal level corresponds to the integrator output signal level just prior to a phase transition of the reference carrier signal. The switch 250 has a common terminal 252 connected to one terminal of a capacitor 254. The capacitor 254 has a value 2xC, where C is the value of the integrating capacitor 220. The other terminal of the capacitor 254 is connected to a ground reference potential, as indicated in the drawing. In a first position, the switch 250 connects the capacitor 254 to a terminal 256, which is connected to the output terminal 222 of the integrator. In a second position, the switch 251 connects the capacitor 254 to a terminal 258 which is connected to the inverting input terminal of the operational amplifier 214. Note that the switch 250 and the switches 240 and 241, as well as other switches described in this patent application, are provided, for example, by analog switches incorporating transistors or the equivalent. The positions of the switch 250 are controlled by a logic circuit 260. When the switch 250 contacts terminal 256 the switch is in a sample/track mode, which samples and tracks the voltage at terminal 222 on the output of the integrator circuit. When the switch 250 contacts terminal 258, it is in the charge recovery mode of operation where whatever charge has been stored on capacitor 254 in the sample/track mode is transferred to the inverting input terminal 218 of the inverter. The logic circuit 260 is provided with a sampletrack/charge-recovery input signal on a terminal 262.

Figure 5A:
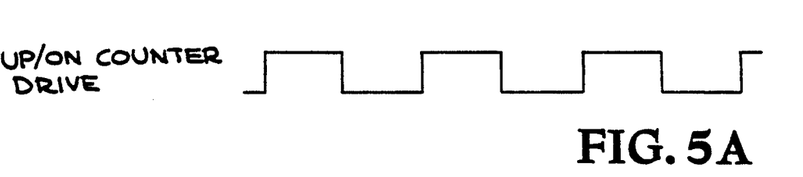
FIG. 5A–5C show timing diagrams for the circuit of FIG. 4.
Figure 5B:
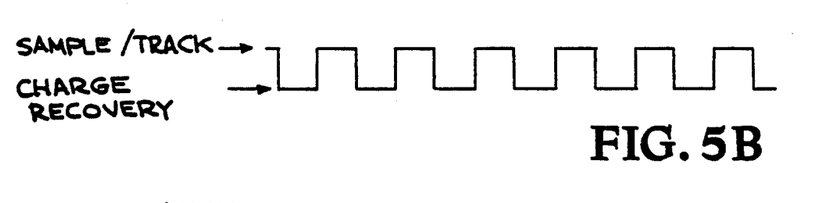
Figure 5C:
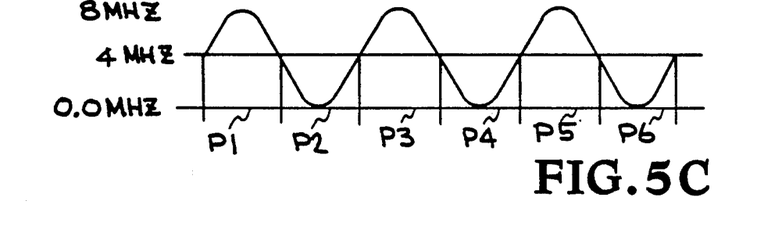

FIGS. 5A-5C show timing relationships for the system of FIG. 4. The up/down counter drive signal as shown in FIG. 5A is a square wave obtained from the DSB-SC subcarrier reference signal. It has, for example, a period of 100 microseconds. FIG. 5B shows the sample/track-charge/recovery signal, which is a square wave having a period of 50 microseconds. FIG. 5C is shown for reference purposes and shows an input signal of approximately 10 kHz with a period of 100 microseconds. FIG. 5C also indicates that the voltage-to-frequency converter provides an output frequency over a range of, for example, 0-8 mHz.

The sample/track-charge/recovery signal is synchronously timed with the edges of the up/down control signal for the up/down counter. When the count direction of the up/down counter is changed from up to down or from down to up, the voltage on the output terminal 222 of the integrator is sampled by capacitor 254, that is, with switch 250 contacting terminal 256. Because the value of the capacitor 254 is 2xC or twice that of C, in effect twice the charge that is stored on capacitor 220 is stored on capacitor 254. After the transition of the up/down control signal, the switch 250 contacts terminal 252 causing the charge stored on capacitor 252 to be injected into the inverting input terminal 218 of the operational amplifier 214 before the next transition in the up/down counter. This injected charge represents twice the integral of the partial-bit analog voltage. An opposite charge of twice the magnitude of the charge for a partial-bit is injected onto the capacitor 220. The long term effect of injecting twice the charge stored on capacitor 220 into the terminal 218 of the operational amplifier 214 for each of the partial bits is to provide long term correction to the accumulated counts of the counter 160 of FIG. 2.

Consequently, the next rebalance pulse after each transition of the 10 kHz reference subcarrier signal is inhibited, more or less, depending on the value of the correction charge associated with the partial-bit information. The logic circuit 260 generates and provides at an output terminal 264 a rebalance inhibit signal which is fed to the charge injection counter 234 by a signal line 266. In this manner, the partial-bit information which would have incorrectly contributed to an up/down count is preserved. This information is rolled forward into the next 50 microsecond period of the reference subcarrier and eventually contributes correctly to an up-down count. This prevents long-term, cumulative errors from creeping into the accumulated information in the digital counter. This system significantly reduces whatever quantizing noise would be reproduced by the partial-bit information. Since the partial-bit information preserved and carried forward is analog information, it can be reproduced and transferred with very high resolution.

Figure 6:
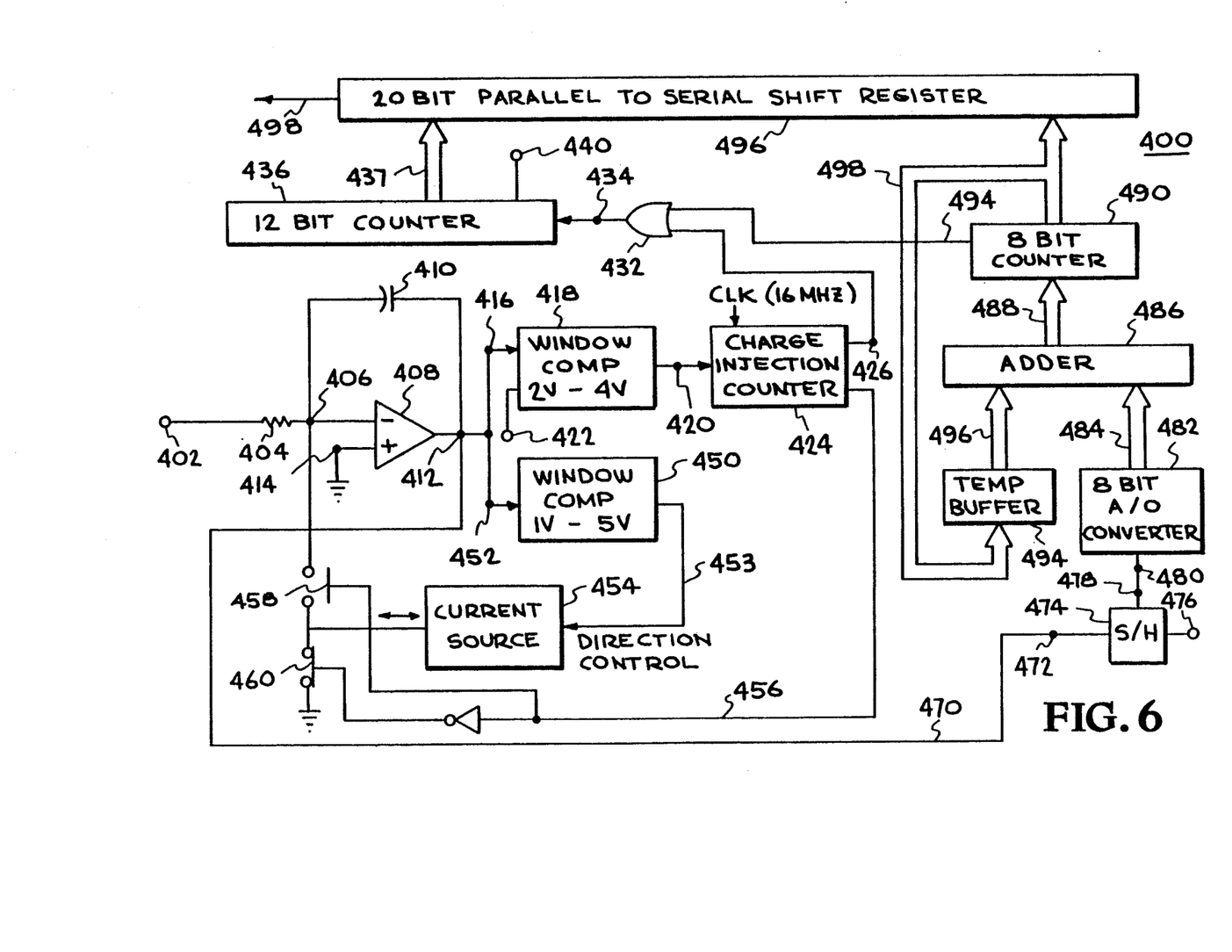
FIG. 6 is a block diagram of another embodiment of a voltage-to-frequency converter which uses digital interpolation.

FIG. 6 shows a digital system 400 for providing digital-partial-bit correction. The system has an input terminal 402 at which is provided an input voltage EIN. A series resistor 404 is connected between the input terminal 402 and inverting input terminal 406 of an operational amplifier 408, which is configured as an integrator. An integrating capacitor 410 is connected between the inverting input terminal 406 and an output terminal 412. A non-inverting input terminal 414 is connected to a ground reference potential. The output terminal 412 of the operational amplifier 408 is connected to an input terminal 416 of a first comparator circuit 418 The comparator circuit 418 provides an output signal at an output terminal 420 when the input signal at terminal 416 exceeds a reference level provided at a reference input terminal 422. Similar to the charge injection counter 234 of FIG. 4, a charge injection counter 424 provides an output pulse at an output terminal 426 for each of the output signals from the comparator 418. The output pulses on terminal 426 are provided on a signal line 428 to an input terminal 430 of an OR gate 432 which has its output terminal 434 connected to an input of a 12 bit counter 436. The output bits from the 12 bit counter 436 on a signal bus 438 represents most significant bits of the detected DSB-SC signal. The counter 436 is an up-/down counter, the direction of which is controlled by a reference carrier signal provided at a terminal 440 thereof. A second comparator 450 has an input terminal 452 connected to the output terminal 412 of the integrator. The second comparator 450 functions to provide a control signal on a signal line 453 to a rebalance current source 454. The signal on 452 provides for the current source 454 to provide a bidirectional current depending on the polarity of the signal line output of the terminal 412 of the operational amplifier 408. A signal on a line 456 from the charge injection counter circuit 452 controls a switch arrangement wherein the current source 454 is connected to a first switch 458 to the inverting input terminal 406 of the operational amplifier 408. Alternatively the switch 460 connects the output of the current source 454 to a ground potential.

The output terminal 412 of the operational amplifier 408 is also connected through a signal line 470 to terminal 472 of a sample and hold circuit 474. The sample and hold circuit includes a control input terminal 476 which activates the sample and hold circuit 474 to sample the integrator voltage corresponding to the partial-bit information at the appropriate time. The output signal of the sample and hold circuit 474 is fed on a signal line 478 to the input terminal 480 of an 8-bit analog-to-digital converter 482, which converts the partial-bit analog signal information to a binary code word corresponding to that partial-bit analog signal The 8 output bits of the converter 482 are provided on a signal bus 484 to the appropriate input terminals of a digital adder circuit 486. The output terminals of the adder 486 are provided on a bus 488 to the input terminals of an 8-bit counter 490. The output terminals of the 8-bit counter 490 are fed on a bus 492 to the input terminals of a temporary storage means 494 on the output of the storage means 494 are fed on a bus 496 to a second set of input terminals for the adder 486. This arrangement functions as an accumulator to accumulate the partial-bit information from successive samples of the partial-bit analog signal.

The output bits of the 8-bit counter 490 represent the least significant bits of a demodulated DSB-SC signal. When the 8-bit counter 490 overflows it provides a pulse on a signal line 494 to a second input terminal of the OR gate 432. This increments the 12-bit counter 436 by one, and thus the partial-bit information is accounted for by incrementing the 12-bit counter. The output bits of the 12-bit counter 436, which represent the most significant bits, and the output bits of the 8-bit counter 490, representing the least significant bits, are combined in a 20-bit parallel-to-serial shift register 496. The bits in the shift register 496 represent the demodulated DSB-SC signal in a digital format. These bits may be read from the shift register 496 in a serial fashion through output signal line 498.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An improved integrating voltage-to-frequency converter for converting a DSB-SC signal having a reference carrier signal into a frequency-encoded signal, said DSB-SC signal adapted to being demodulated by using an up-down counter demodulator which is alternately switched between an up-count and a down-count in synchronism with the phase transitions of the reference carrier signal to digitally demodulate the frequency-encoded DSB-SC signal, comprising:

an integrator circuit including an operational amplifier having an output terminal and inverting input terminal, said integrator circuit including an integrating capacitor connected between the output terminal and the inverting input terminal of said operational amplifier, said integrator circuit also including a series input resistor connected between the inverting input terminal of said operational amplifier and an input signal voltage terminal for said voltage-to-frequency converter;

a comparator circuit having a signal input terminal coupled to the output terminal of said operational amplifier, said comparator circuit having a reference input terminal and an output signal terminal, said comparator circuit providing a comparator output signal when the level of the output signal of the integrator circuit exceeds a reference level at the reference input terminal;

means for rebalancing the integrator circuit output terminal to a predetermined level by injecting a predetermined charge into the inverting input terminal of said operational amplifier, said rebalancing being controlled by a rebalance control pulse which is generated in response to a comparator output signal;

means for tracking and storing a partial-bit analog signal level at the output of the integrator, said partial-bit analog signal level corresponding to the integrator output signal level just prior to a phase transition of the reference carrier signal from a one half-period to the next half-period of said reference signal;

means for correcting the count of the up-down counter to account for the partial-bit analog signal information.

2. The converter of claim 1 including means for accumulating partial-bit analog signal level information;

wherein the means for accumulating and for correcting includes means for injecting a charge, which is two times the magnitude and opposite in sign to the partial-bit analog signal level, into the non-inverting input terminal of the operational amplifier immediately subsequent to a phase transition of the reference carrier signal to thereby effective include the effect of a partial-bit analog signal level from a first half-period into the next half-period of the reference signal such that, when the DSB-SC signal is demodulated using an up-down counter, the partial-bit information is included in the resultant output count of the up-down counter demodulator.

3. The converter of claim 1 wherein the means for correcting includes:

means for converting the partial-bit analog signal level to a binary code word corresponding to the partial-bit analog signal;

summer means for algebraically adding a number of the binary code words to form an algebraic sum;

means for detecting that the algebraic sum exceeds a value sufficient to form a correction count for the up-down counter demodulator;

means for incrementing the up-down counter in accordance with the correction count.

4. A method of converting an input DSB-SC signal into a frequency-encoded output signal, wherein said DSB-SC signal is adapted to being demodulated with an up/down counter demodulator which is alternately switched between an up-count and a down-count in synchronism with the phase transitions of a reference carrier signal, comprising the steps of:

integrating the input signal in an integrator to provide an integrator or output signal;

comparing the integrator output signal to a reference signal;

providing an output pulse signal when the integrated output signal exceeds a predetermined reference signal level;

resetting the integrator output signal level to a predetermined level when an output pulse signal is provided;

storing a partial-bit analog signal level corresponding to the integrator output signal level just prior to a phase transition of the reference carrier signal; and correcting the count of the up/down counter to account for the partial-bit analog signal information.

5. The method of claim 4 including the step of injecting a correction charge, corresponding to the partial-bit analog signal, into the integrator to effectively include the effect of the partial-bit analog signal level from just prior to the phase transition of the reference carrier signal into the next half-period of the reference signal.

6. The method of claim 5 wherein said correction charge includes a charge which is two times the magnitude and opposite in sign to the charge corresponding to the partial-bit analog signal.

7. The method of claim 4 wherein the step of correcting includes the steps of:

converting the partial-bit analog signal level to a binary code word;

algebraically summing a number of binary code words to form an algebraic sum;

detecting that said algebraic sum exceeds a value sufficient to form a correction count for an up/down counter demodulator; and incrementing said up/down counter demodulator with said correction count.

* * * * *